US012795879B2

(12) United States Patent
Morita

(10) Patent No.: US 12,795,879 B2
(45) Date of Patent: Nov. 10, 2026

(54) INFORMATION PROCESSING DEVICE, MOUNTING SYSTEM, AND INFORMATION PROCESSING METHOD

(71) Applicant: FUJI CORPORATION, Chiryu (JP)

(72) Inventor: Yukitoshi Morita, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 329 days.

(21) Appl. No.: 18/698,444

(22) PCT Filed: Oct. 22, 2021

(86) PCT No.: PCT/JP2021/039087
§ 371 (c)(1),
(2) Date: Apr. 4, 2024

(87) PCT Pub. No.: WO2023/067794
PCT Pub. Date: Apr. 27, 2023

(65) Prior Publication Data

US 2024/0431085 A1 Dec. 26, 2024

(51) Int. Cl.
*H05K 13/02* (2006.01)
*H05K 13/04* (2006.01)
*H05K 13/08* (2006.01)

(52) U.S. Cl.
CPC ....... *H05K 13/021* (2013.01); *H05K 13/0417* (2013.01); *H05K 13/086* (2018.08)

(58) Field of Classification Search
None
See application file for complete search history.

(56) References Cited

U.S. PATENT DOCUMENTS

2002/0053134 A1* 5/2002 Hidese ............... H05K 13/0413 29/700
2012/0069584 A1* 3/2012 Kawabe ................. H05K 1/189 174/254
2016/0273934 A1* 9/2016 Seko .................. G01C 21/3667
2017/0303448 A1* 10/2017 Iisaka .................. H05K 13/086
2018/0242485 A1* 8/2018 Kondo ............... H05K 13/0473
2018/0376635 A1* 12/2018 Iisaka ................ H05K 13/0417
(Continued)

FOREIGN PATENT DOCUMENTS

JP 2002-009495 A 1/2002
JP 2012-221966 A 11/2012
(Continued)

OTHER PUBLICATIONS

International Search Report issued Dec. 21, 2021 in PCT/JP2021/039087, filed on Oct. 22, 2021, 2 pages.

*Primary Examiner* — Ariel Mercado-Vargas
(74) *Attorney, Agent, or Firm* — Oblon, McClelland, Maier & Neustadt, L.L.P.

(57) ABSTRACT

An information processing device is used in a mounting system including a mounting device that includes multiple attachment sections configured to attach a component supply device and that perform mounting process of a component on a processing target object, and includes a control section configured to set, for each production type, attachment position information related to an attachment position of the component supply device based on a production plan including multiple production types of the processing target object and a target time related to setup change of the component supply device.

12 Claims, 11 Drawing Sheets

(56) References Cited

U.S. PATENT DOCUMENTS

| | | | | |
|---|---|---|---|---|
| 2020/0103880 | A1* | 4/2020 | Nozawa | H05K 13/021 |
| 2020/0323114 | A1* | 10/2020 | Matsushita | H05K 13/0419 |
| 2020/0404818 | A1* | 12/2020 | Matsushita | H05K 13/0417 |
| 2022/0264778 | A1* | 8/2022 | Maezono | H05K 13/0409 |
| 2024/0015942 | A1* | 1/2024 | Matsushita | H05K 13/043 |

FOREIGN PATENT DOCUMENTS

| | | | |
|---|---|---|---|
| JP | 2014-056901 | A | 3/2014 |
| WO | WO 2020/003378 | A1 | 1/2020 |
| WO | WO 2021/191968 | A1 | 9/2021 |

* cited by examiner

| PRODUCTION | ATTACHMENT SECTION NUMBER OF MOUNTING ATTACHMENT SECTION | | | | | | ATTACHMENT SECTION NUMBER OF BUFFER ATTACHMENT SECTION | | | | | |
|---|---|---|---|---|---|---|---|---|---|---|---|---|
| | #1 | #2 | #3 | #4 | ··· | #m | #1 | #2 | #3 | #4 | ··· | #n |
| Production 1 | F** | F** | F** | F** | ··· | F** | | F** | F** | F** | ··· | |
| Production 2 | | F** | F** | F** | ··· | | F** | F** | F** | F** | ··· | |
| Production 3 | F** | F** | F** | F** | ··· | | F** | F** | F** | F** | ··· | F** |
| ⋮ | ⋮ | | | | | | | | | | | |
| Production X | | | F** | F** | ··· | | | | | | ··· | |

Fig. 9

| SETUP TYPE | OPTIMUM ARRANGEMENT | COMMON ARRANGEMENT (INDIVIDUAL) | COMMON ARRANGEMENT (FIXED) | COMB TOOTH ARRANGEMENT | BALANCE (PRESENT DISCLOSURE) |
|---|---|---|---|---|---|
| OPERATION | FEEDER INDIVIDUAL /DEVICE BATCH | FEEDER INDIVIDUAL | DEVICE BATCH | FEEDER INDIVIDUAL | FEEDER INDIVIDUAL |
| NUMBER OF MODULES (DEVICE OCCUPANCY) | 1 | 3 | 4 | 2 | 1.5 |
| NUMBER OF FEEDERS | 1 | 3 | 4 | 2 | 2 |
| INVESTMENT COST | 1 | 3 | 4 | 2 | 1.5 |
| LARGE SETUP CHANGE TIME (FEEDER CHANGE: MANY) | 3 | 2 | 1 | 2 | 2 |
| SMALL SETUP CHANGE TIME (FEEDER CHANGE: SMALL) | 3 | 2 | 1 | 1 | 2 |

1 (GOOD) ⟷ 4 (DETERIORATION)

INFORMATION PROCESSING DEVICE, MOUNTING SYSTEM, AND INFORMATION PROCESSING METHOD

TECHNICAL FIELD

The present description discloses an information processing device, a mounting system, and an information processing method.

BACKGROUND ART

Conventionally, for example, in a mounting system for mounting a component on a processing target object such as a substrate, there has been proposed a mounting system in which a component supply device to be newly arranged by switching a job is allocated to be distributed to multiple mounting devices, an arrangement possible position including a position where a component supply device which has been arranged before the switching and is not scheduled to be used in the job after the switching is exchanged is selected as an arrangement position of the component supply device, and an arrangement of the component supply device in the job is determined (for example, refer to Patent Literature 1). In this device, it is possible to improve production efficiency by preventing exchange of the component supply device accompanying job switching from concentrating on a specific mounting device.

PATENT LITERATURE

Patent Literature 1: WO2020/003378

BRIEF SUMMARY

Technical Problem

In Patent Literature 1 described above, the production efficiency is improved by preventing the concentration of the exchange of the component supply device due to the switching of the job on a specific mounting device, but the prevention is still insufficient, and there is a need to improve production efficiency.

The present disclosure has been made in view of such a problem, and a main object of the present disclosure is to provide an information processing device, a mounting system, and an information processing method capable of further improving production efficiency based on a target time for setup change.

Solution to Problem

An information processing device, a mounting system, and an information processing method disclosed in the present description adopt the following means in order to achieve the main object described above.

According to the present disclosure, there is provided an information processing device for use in a mounting system including a mounting device that includes multiple attachment sections configured to attach a component supply device, the mounting device being configured to perform mounting process of a component on a processing target object, the information processing device including a control section configured to set, for each production type, attachment position information related to an attachment position of the component supply device based on a production plan including multiple production types of the processing target object and a target time related to setup change of the component supply device.

In this information processing device, since the attachment position of the component supply device is set based on the production plan and the target time related to the setup change, it is possible to set the attachment position for executing the setup change satisfying the target time according to the production plan. Then, the mounting device executes the mounting process at the attachment position.

BRIEF DESCRIPTION OF DRAWINGS

FIG. 9 is a diagram illustrating an example of item evaluation in various setup.

DESCRIPTION OF EMBODIMENTS

Figure 1:
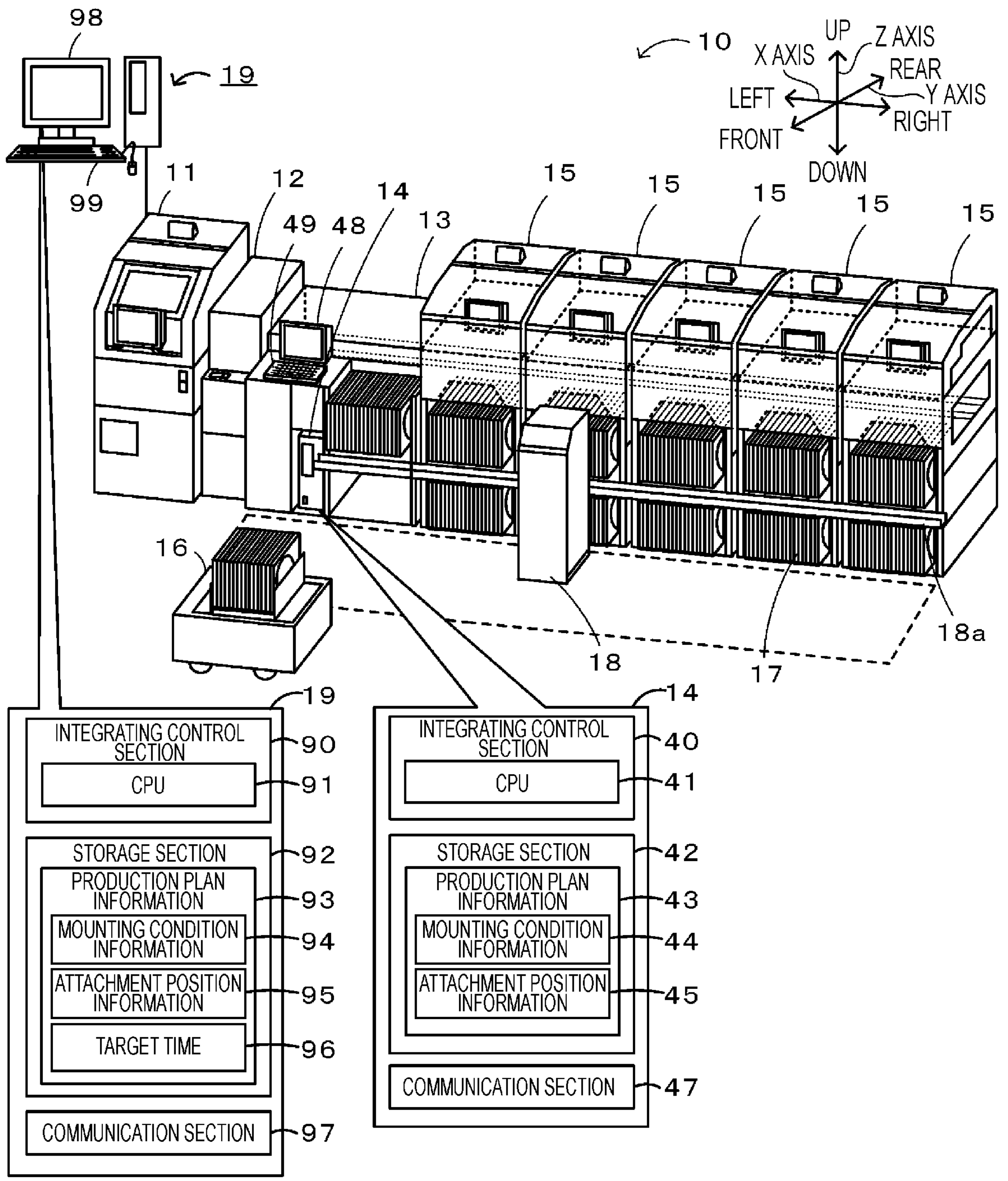
FIG. 1 is a schematic diagram illustrating an example of mounting system 10.
Figure 2:
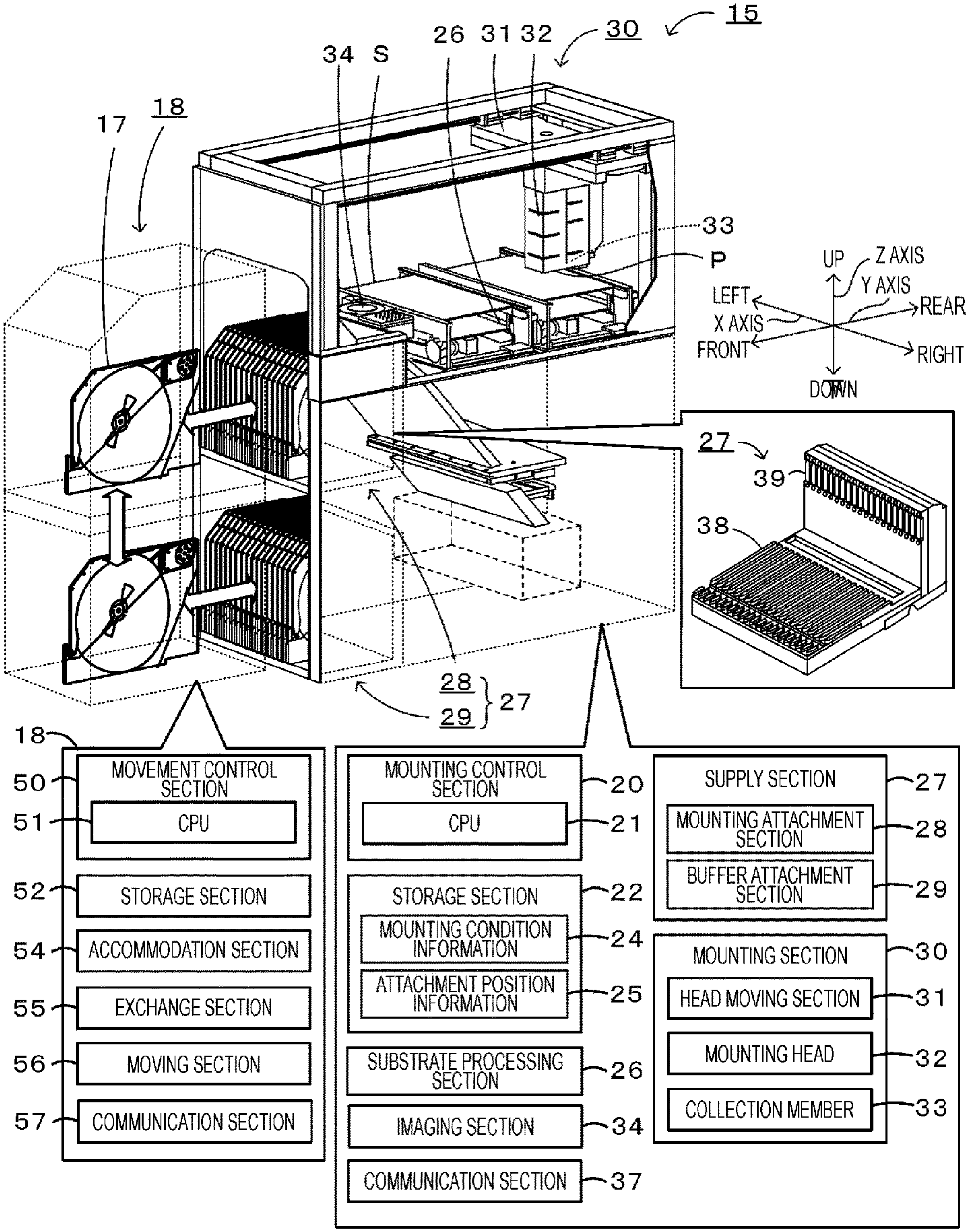
FIG. 2 is a diagram schematically illustrating configurations of mounting device 15 and loader 18.
Figure 3:
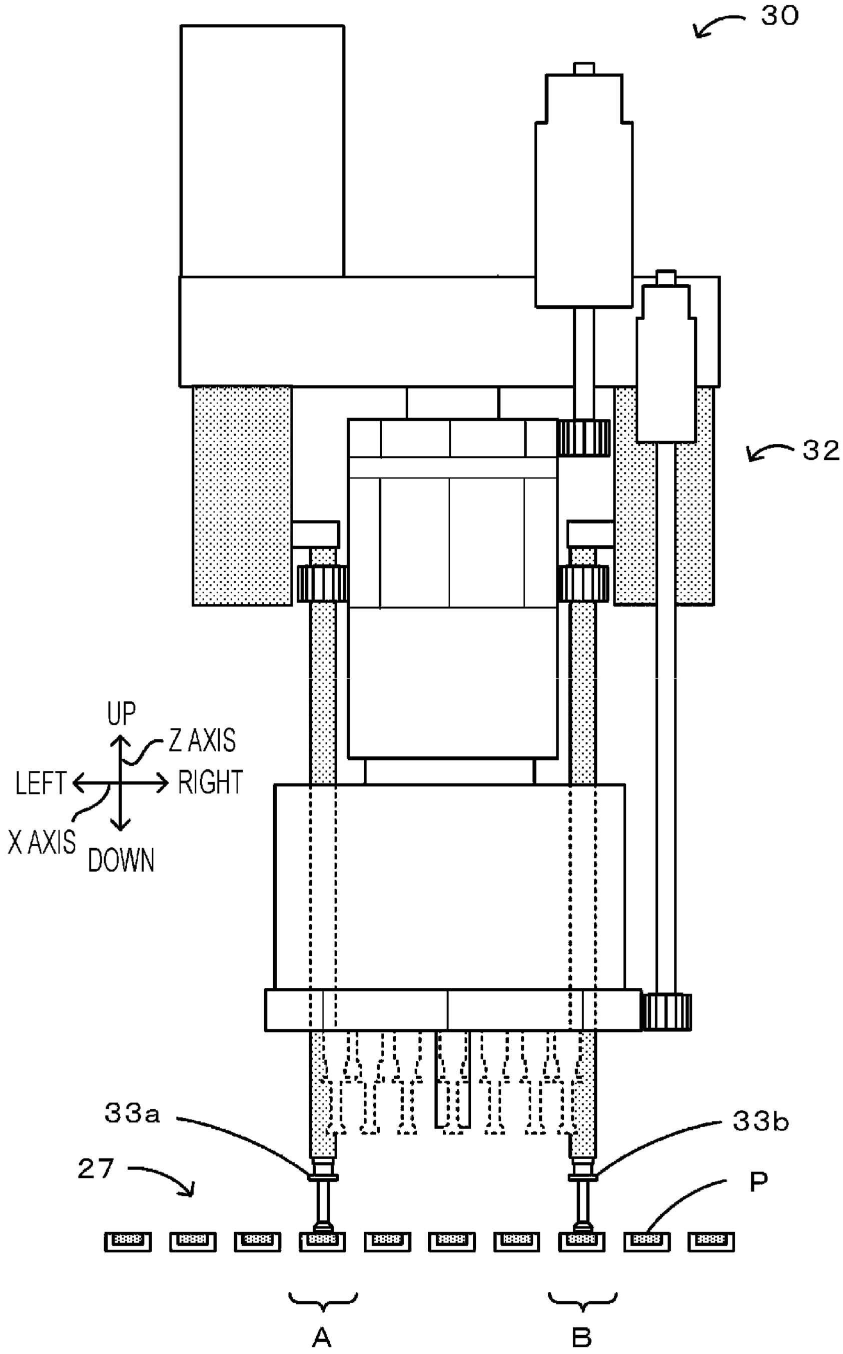
FIG. 3 is a diagram in which mounting head 32 simultaneously collects component P.
Figure 4:
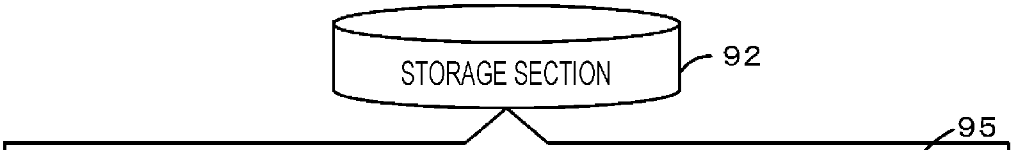
FIG. 4 is a diagram illustrating an example of attachment position information 95 stored in storage section 92.

The present embodiment will be described below with reference to drawings. FIG. 1 is a schematic diagram illustrating an example of mounting system 10 of the present disclosure. FIG. 2 is a diagram schematically illustrating configurations of mounting device 15 and loader 18 that is a movable working device. FIG. 3 is a diagram in which mounting head 32 simultaneously collects component P. FIG. 4 is a diagram illustrating an example of attachment position information 95 stored in storage section 92 of integrating device 19. In the present embodiment, a left-right direction (X axis), a front-rear direction (Y axis), and an up-down direction (Z axis) are as illustrated in FIGS. 1 to 3.

Mounting system 10 is configured, for example, as a production line in which mounting devices 15 performing a process of mounting components P on substrate S serving as a processing target object are arranged in a conveyance direction of substrate S. Here, the processing target object will be described as substrate S, but the processing target object is not particularly limited as long as the processing target object is an object on which component P is mounted, and may be a substrate having a three-dimensional shape. As illustrated in FIG. 1, mounting system 10 includes printing device 11, print inspection device 12, storage device 13, management device 14, mounting device 15, a mounting inspection device (not illustrated), automatic conveyance vehicle 16, loader 18, integrating device 19, and the like. Printing device 11 is a device that prints viscous fluid such as a solder paste on substrate S. Print inspection device 12 is a device that inspects the state of printed solder or substrate S. The mounting inspection device is a device that inspects a state of component P arranged on substrate S.

As illustrated in FIG. 1, storage device 13 is a storage place in which feeder 17 as a component supply device for use in mounting device 15 is temporarily stored. Storage device 13 includes a conveyance device that conveys substrate S and management device 14 that manages information, and is provided between printing inspection device 12 and mounting device 15. Storage device 13 has an attachment section similar to that of supply section 27. When feeder 17 is connected to the attachment section, a controller of feeder 17 outputs information on feeder 17 to management device 14 connected to storage device 13. In storage device 13, while feeders 17 are conveyed by automatic conveyance vehicle 16, feeders 17 may be conveyed by operator W.

Management device 14 is configured as a device that manages feeders 17, stores execution data or the like executed by loader 18, and manages storage device 13 and loader 18. As illustrated in FIG. 1, management device 14 includes management control section 40, storage section 42, communication section 47, display section 48, and input device 49. Management control section 40 is configured as a microprocessor centered on CPU 41 and controls the entire device. Storage section 42 stores, as information used for controlling storage device 13 and loader 18, production plan information 43 including multiple mounting condition information 44, attachment position information 45 including information on the attachment position of feeder 17, and the like. Mounting condition information 44 includes information related to a mounting process for producing specific substrate S, and is transmitted from integrating device 19 and stored in storage section 42. Attachment position information 45 is information related to the attachment position in supply section 27 of feeder 17, and is created by integrating device 19 based on production plan information 43. Communication section 47 is an interface that communicates with external devices such as mounting device 15 and loader 18. Display section 48 is a liquid crystal screen that displays various information. Input device 49 includes a keyboard, a mouse, and the like through which operator W inputs various commands.

Mounting device 15 is a device that collects component P and arranges component P on substrate S. As illustrated in FIG. 2, mounting device 15 includes mounting control section 20, storage section 22, substrate processing section 26, supply section 27, mounting section 30, imaging section 34, and communication section 37. Mounting control section 20 is configured as a microprocessor centered on CPU 21 and controls the entire device, as illustrated in FIG. 2. Mounting control section 20 outputs control signals to substrate processing section 26, supply section 27, mounting section 30, and imaging section 34, and inputs signals from substrate processing section 26, supply section 27, and mounting section 30 and captured images from imaging section 34. Storage section 22 stores mounting condition information 24, attachment position information 25, and the like. Mounting condition information 24 is a production job, and includes information on components P and information such as an arrangement order and an arrangement position in which components P are mounted on substrate S. Attachment position information 25 is information including the position and the type of feeder 17 attached to supply section 27 of mounting device 15, the component type of feeder 17, the number of remaining components, and the like. In attachment position information 25, integrating device 19 creates information on the attachment position of feeder 17 that balances mounting efficiency, a setup change time, and the number of attachment sections, attachment position information 25 is transmitted from integrating device 19 and stored in storage section 22.

Substrate processing section 26 is a unit that performs carrying in, conveyance, fixation of substrate S at a mounting position, and carrying out thereof. Substrate processing section 26 has a pair of conveyor belts provided at intervals in the front-rear direction and spanning the left-right direction. Substrate S is conveyed by the conveyor belts. Substrate processing section 26 includes two pairs of the conveyor belts, and can convey and fix two substrates S simultaneously.

Supply section 27 is a unit that supplies component P to mounting section 30. Supply section 27 attaches feeder 17 as a component supply device to one or more attachment sections. As illustrated in FIG. 2, supply section 27 includes two upper and lower attachment sections to which feeder 17 can be attached in front of mounting device 15. The upper stage is mounting attachment section 28 from which the component can be collected by mounting section 30, and the lower stage is buffer attachment section 29 from which the component cannot be collected by mounting section 30. Here, mounting attachment section 28 and buffer attachment section 29 are collectively referred to as attachment sections. Feeder 17 from which the component is collected by mounting head 32 is attached to mounting attachment section 28. When there is a vacancy in mounting attachment section 28, feeder 17 for setup change that is used in the next production is arranged in advance. Buffer attachment section 29 is used in a case in which feeder 17 that is to be used next or feeder 17 which has been used is temporarily stored. Buffer attachment section 29 is arranged in advance with feeder 17 for provision that is exchanged due to component shortage, feeder 17 for setup change that is used in the next production, or the like. Supply section 27 has an attachment section including multiple slots 38 arranged in the X direction at predetermined intervals, into which feeders 17 are inserted, and connection sections 39 into which connectors provided at the distal ends of feeders 17 are inserted.

Mounting section 30 is a unit that collects component P from supply section 27 and arranges component P on substrate S fixed to substrate processing section 26. Mounting section 30 includes head moving section 31, mounting head 32, and collection member 33. Head moving section 31 includes a slider moving by being guided by guide rails in the XY directions, and a motor that drives the slider. Mounting head 32 collects one or more components P and is moved in the XY directions by head moving section 31. Mounting head 32 is detachably attached to the slider. Nozzles as one or more collection members 33 are detachably attached to the lower surface of mounting head 32. Nozzles are configured to collect component P by making use of a negative pressure. Collection member 33 for collecting component P may be a mechanical chuck for mechanically holding component P instead of nozzle. As illustrated in FIG. 3, for example, mounting head 32 lifts and lowers collection members **33*a* and 33*b* in the Z axis direction at two positions, that is, collection member 33*a* located at first lifting and lowering position A located at the left end portion in the X axis direction and collection member 33*b* located at second lifting and lowering position B located at the right end portion. Collection members 33*a* and 33*b* are collectively referred to as collection member 33. Mounting head 32 is configured to be able to execute a simultaneous collection process of collecting multiple components P at the same collection timing by collection members 33***a* and 33*b*. The term "the same collection timing" may be, for example, a period from when mounting head 32 is arranged at a collection position to when mounting head 32 is subsequently moved to a mounting position, or may be a period from when mounting head 32 is arranged at the collection position to when mounting head 32 is subsequently moved to the mounting position. Here, the term "the same collection timing" includes a case where multiple components P are simultaneously collected, and this is also referred to as "simultaneous collection" for convenience.

Imaging section 34 is a device that captures an image of one or more components P, which are collected and held by mounting head 32, from below. Imaging section 34 captures the image of component P when mounting head 32 that has collected component P passes above imaging section 34, and outputs the captured image to mounting control section 20. Mounting control section 20 detects the collection state of component P using the captured image. Communication section 37 is an interface for exchanging information with external devices such as management device 14 and integrating device 19.

Automatic conveyance vehicle 16 conveys a member used in mounting system 10, for example, feeder 17 used in mounting device 15. For example, automatic conveyance vehicle 16 automatically conveys feeder 17 and the like between a warehouse (not illustrated) and storage device 13. This automatic conveyance vehicle 16 may be configured as an automatic guided vehicle (AGV) which moves on a predetermined track, or may be configured as an autonomous mobile robot (AMR) that moves to a destination on a free route by detecting surroundings thereof.

Loader 18 is a movable working device and is a device that is moved (refer to a dotted line in FIG. 1) within a moving region in front of mounting system 10 and automatically recovers and provides feeders 17 of mounting device 15. As illustrated in FIG. 2, this loader 18 includes movement control section 50, storage section 52, accommodation section 54, exchange section 55, moving section 56, and communication section 57. Movement control section 50 is configured as a microprocessor centered on CPU 51 and controls the entire device. Movement control section 50 controls the entire device such that feeder 17 is recovered from supply section 27 or feeder 17 is provided to supply section 27, and feeder 17 is moved to and from storage device 13. Storage section 52 is, for example, an HDD that stores various data such as a processing program. Accommodation section 54 has an accommodation space in which feeders 17 are accommodated. Accommodation section 54 is configured to accommodate, for example, four feeders 17. Exchange section 55 is a mechanism that carries feeder 17 in and out and moves feeder 17 to upper and lower stages (refer to FIG. 2). Exchange section 55 has a clamp section that clamps feeder 17, a Y-axis slider that moves the clamp section in the Y axis direction (front-rear direction), and a Z-axis slider that moves the clamp section in the Z axis direction (up-down direction). Exchange section 55 performs attachment and detachment of feeder 17 in mounting attachment section 28 and attachment and detachment of feeder 17 in buffer attachment section 29. Moving section 56 is a mechanism that moves loader 18 in the X axis direction (left-right direction) along X axis rail 18*a* disposed in front of mounting device 15. Communication section 57 is an interface for exchanging information with external devices such as management device 14 and each mounting device 15. Loader 18 outputs the current position or executed work details to management device 14.

Integrating device 19 is an information processing device of the present disclosure, and is configured as a server that creates and manages information used by each device of mounting system 10, for example, production plan information 43. As illustrated in FIG. 1, integrating device 19 includes integrating control section 90, storage section 92, communication section 97, display section 98, and input device 99. Integrating control section 90 is configured as a microprocessor centered on CPU 91, and controls the entire device. Storage section 92 stores production plan information 93 as information used in mounting system 10. Production plan information 93 includes multiple pieces of mounting condition information 94 necessary for mounting system 10 to produce substrate S, attachment position information 95, and target time 96. Mounting condition information 94 is information similar to mounting condition information 44. Attachment position information 95 is the same information as attachment position information 45, and is information in which the attachment section number of supply section 27 and the identifier of feeder 17 attached to the attachment section and/or the identifier of component P held by feeder 17 are associated with each production type of substrate S, as illustrated in FIG. 4. Target time 96 is a time related to the setup change of the production type of substrate S, and may be, for example, a time allowed for the setup change. Target time 96 may be input by an operator of mounting system 10 and stored in storage section 92. Communication section 97 is an interface that performs communication with an external device. Display section 98 is a liquid crystal screen that displays various information. Input device 99 includes a keyboard, a mouse, and the like through which operator W inputs various commands.

Figure 5:
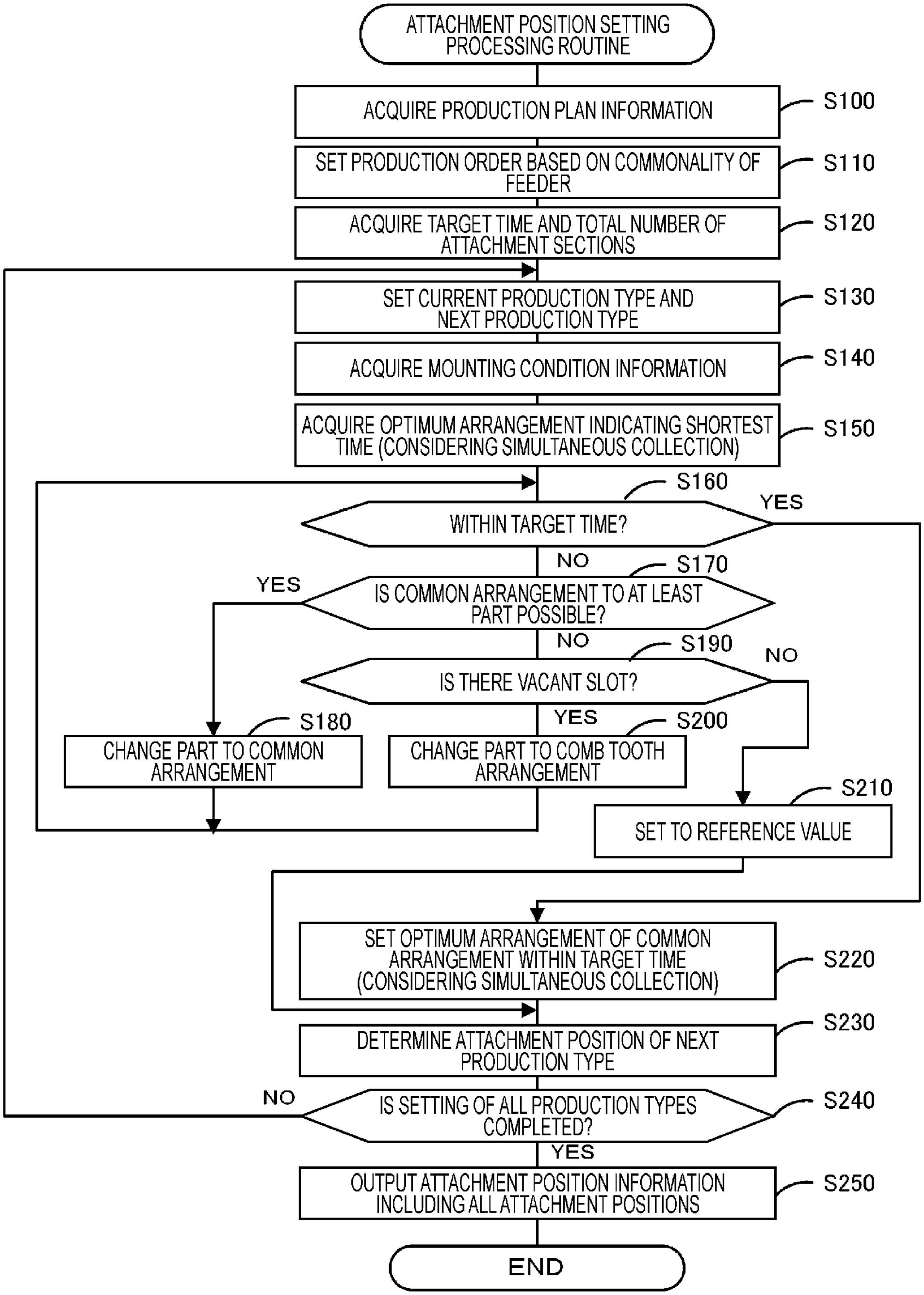
FIG. 5 is a flowchart illustrating an example of an attachment position setting processing routine.

Next, an operation of mounting system 10 of the present embodiment configured as described above, that is, processing of setting an attachment position of feeder 17 in each mounting device 15 will be described. FIG. 5 is a flowchart illustrating an example of an attachment position setting processing routine executed by CPU 91 of integrating control section 90 provided in integrating device 19. This routine is stored in storage section 92 of integrating device 19, and is executed in response to a start instruction by the operator before the start of the production process of mounting system 10, for example, when production plan information 93 is determined.

When the routine is started, CPU 91 reads and acquires production plan information 93 from storage section 92 (S100). Production plan information 93 is information including the type (production type) or the number of substrates S to be produced, a position or the type of component to be mounted, the number of components, and the like, but an attachment position of feeder 17 holding a component, a component collection order, a component arrangement order, and the like are not set yet and are set through processing described below. Next, CPU 91 acquires the commonality of components P included in acquired production plan information 93, and sets the production order based on the commonality of feeders 17 (S110). For example, in a case where feeder 17 holding the same type of components P is used over multiple production types, CPU 91 may rearrange these in a collective production order. In the case of using feeder 17 that holds common component P over multiple production jobs, since it is not necessary to remove feeder 17 during the setup change, it is possible to further shorten the setup change time and to further improve the mounting efficiency as a whole. In a case where the operator does not want to change the production order, the operator may be able to perform setting to omit this processing in advance.

Next, CPU 91 acquires the target time and the total number of attachment sections of mounting system 10 (S120). The target time is a time related to the setup change, and CPU 91 acquires the target time from the input of the operator. CPU 91 acquires the total number of attachment sections based on the device configuration of mounting device 15 provided in mounting system 10. Next, CPU 91 sets the current production type and the next production type based on the production order set in S110 (S130), and acquires the mounting condition information thereof (S140). CPU 91 sets the current production types and the next production types in order to consider the arrangement common to the two production types to be subsequently performed. For the current production types and the next production types, first and second production types are set first. After acquiring mounting condition information 94 in S140, CPU 91 roughly calculates the mounting processing time in each mounting device 15, and allocates feeders 17 to mounting devices 15 so that the mounting processing time is substantially the same between the devices.

Next, CPU 91 acquires the optimum arrangement indicating the shortest time of the current production type while considering the simultaneous collection of mounting head 32 without considering the common with another production type (S150). CPU 91 acquires the optimum arrangement of the current production types and also acquires the optimum arrangement of the next production types. CPU 91 may obtain the time required for the collection of component P and the times required for the movement from the collection position to the arrangement position via imaging section 34 and the movement from the arrangement position to the collection position, repeatedly perform the processing of obtaining the total processing time in the production type by appropriately changing the arrangement position of feeder 17, and acquire the arrangement of feeder 17 having the shortest processing time as the optimum arrangement. CPU 91 may set the arrangement position of feeder 17 such that the movement path of mounting head 32 becomes shorter. In this optimum arrangement, for example, the attachment position is set so that feeder 17 used more frequently tends to be attached in slot 38 closer to imaging section 34. Further, in the optimum arrangement in consideration of simultaneous collection, the attachment position is set so that feeder 17 holding the more frequently used components P tends to be attached to slot 38 at an interval matching first lifting and lowering position A and second lifting and lowering position B.

After the optimum arrangement is set in S150, CPU 91 determines whether the setup change time is within the target time in a case where the current production type is attached to mounting attachment section 28 and the next production type is attached to buffer attachment section 29 (S160). At this time point, the mounting processing time of each production type is the shortest, but the setup change time is not the shortest. CPU 91 determines whether the setup change time reaches the target time based on, for example, the time required for the standard movement of loader 18 and the time required for the exchange process of feeder 17. When the setup change time is not within the target time, CPU 91 determines whether the common arrangement in which the attachment position of the next production types is common to at least a part of the currently attached production types is possible (S170). CPU 91 determines whether the common arrangement is possible based on whether there is feeder 17 holding same component P in the current production type and the next production type. When the common arrangement is possible, at least a part of feeders 17 of the next production types capable of the common arrangement is changed to the common arrangement (S180), and the processing after S160 is performed. For example, when there are multiple feeders 17 that can be arranged in common, CPU 91 may select feeder 17 to be changed based on the use frequency of component P. CPU 91 may preferentially change the common arrangement of feeders 17 having a higher use frequency.

Meanwhile, when it is determined in S170 that the common arrangement is not possible, CPU 91 determines whether there is a vacant slot that is not to be used based on the total number of attachment sections and the number of used attachment sections (S190), and when there is a vacant slot, CPU 91 changes at least a part of the vacant slots to a comb tooth arrangement in which the attachment position of the next production type is vacant (S200), and performs the processing after S160. Here, CPU 91 may change the attachment position of mounting attachment section 28 and buffer attachment section 29 to a comb tooth position at which the attachment position of the next production type is vacant in a state where the attachment positions do not overlap in the upper and lower stages. CPU 91 provides a vacant slot in mounting attachment section 28, and moves feeder 17 arranged on buffer attachment section 29 in advance in accordance with the vacant slot. When there are multiple feeders 17 that can be changed to the comb tooth arrangement, CPU 91 may select the position of the vacant slot based on the arrangement position of feeders 17. CPU 91 may preferentially change feeder 17 closer to the center to the comb tooth arrangement. In this manner, CPU 91 moves it from a position where it is once arranged to set the attachment position which provides the comb tooth arrangement.

Figure 6:
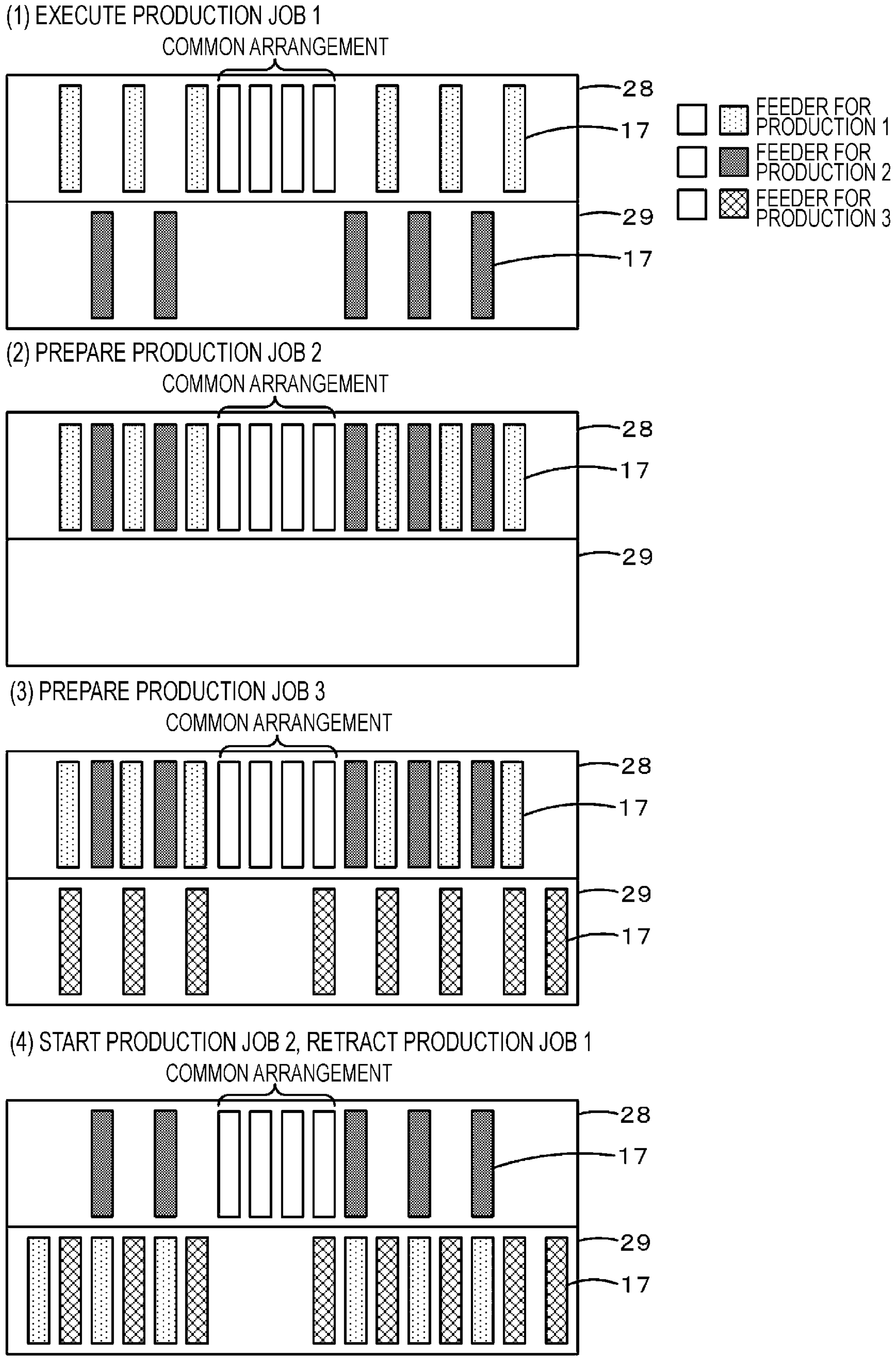
FIG. 6 is a diagram of an example of an exchange process of feeder 17 in a comb tooth arrangement of supply section 27.

Here, the comb tooth arrangement will be described. FIG. 6 is a diagram of an example of an exchange process of feeder 17 in a comb tooth arrangement of supply section 27. As illustrated in FIG. 6, the comb tooth arrangement is an arrangement method in which a vacant slot is provided in the current production type in mounting attachment section 28, and the next production type in buffer attachment section 29 is arranged below the vacant slot. In the comb tooth arrangement, during the execution of production job 1 (1), feeder 17 is attached to mounting attachment section 28 as preparation for production job 2 (2), and feeder 17 used for production job 3 can be pre-arranged to buffer attachment section 29 (3). In the comb tooth arrangement, the production of production job 2 can be started immediately after the end of production job 1 (4), and feeder 17 of production job 1 can be retracted to buffer attachment section 29. As described above, in the comb tooth arrangement, there is an advantage of further shortening the setup change time, but since the number of vacant slots is required, there is a disadvantage that more mounting devices 15 (modules) are required. CPU 91 can shorten the time required for the setup change by introducing the comb tooth arrangement to at least a part.

Figure 7:
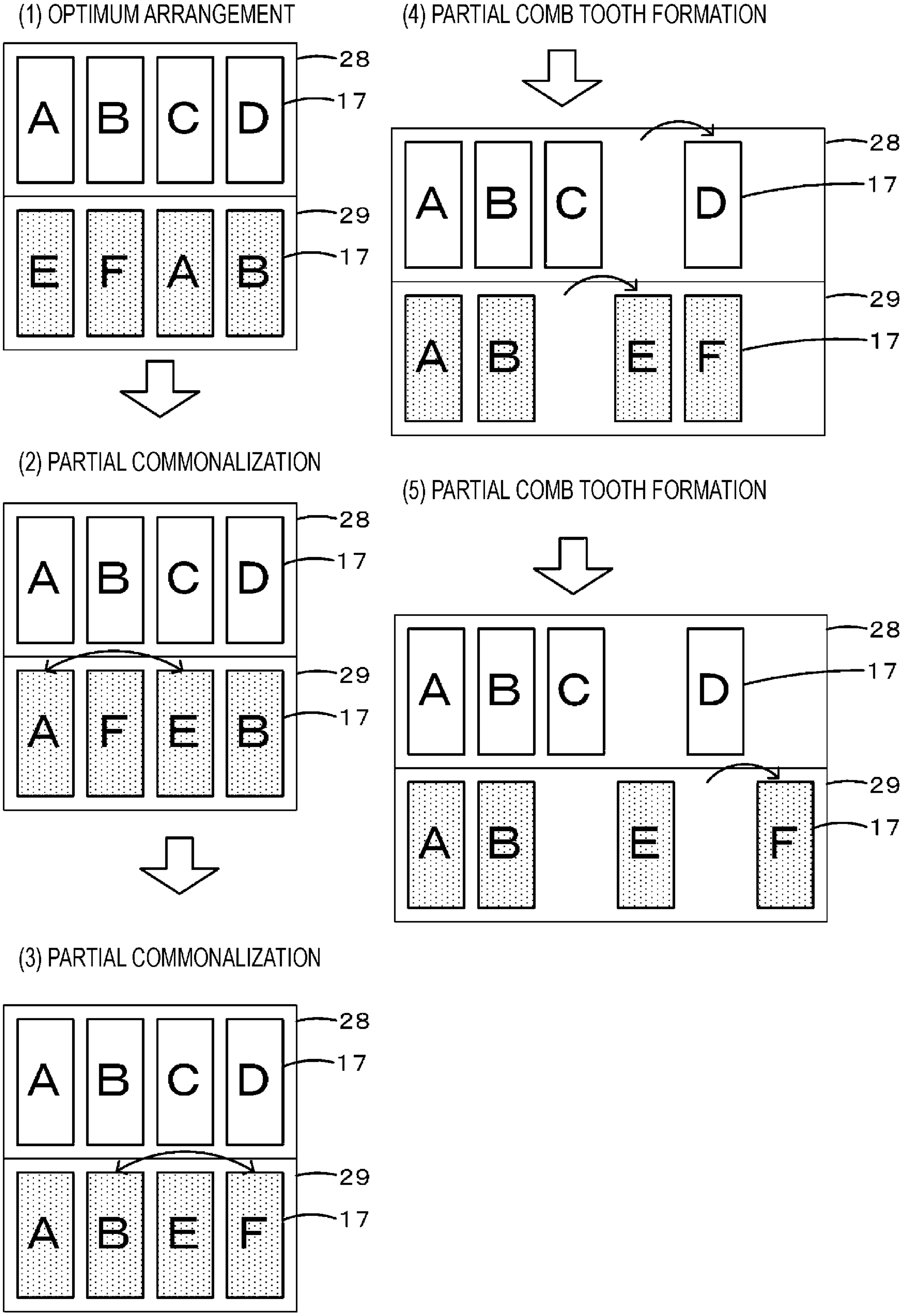
FIG. 7 is a diagram illustrating an example of a balance arrangement process.

FIG. 7 is a diagram illustrating an example of the balance arrangement process of the present disclosure executed in S150 to S200. As illustrated in FIG. 7, CPU 91 sets the optimum arrangement indicating the shortest time of the current production type without considering the common with the other production type (1). Next, when the time required for the setup change in the optimum arrangement does not fall within the target time, CPU 91 sets the common arrangement in which the attachment position of the next production types is common to at least a part (2) and (3). Further, when the time required for the setup change in the common arrangement does not fall within the target time, CPU 91 sets the comb tooth arrangement in which the attachment position of the next production type is vacant to at least a part (4) and (5). As described above, CPU 91 first sets the attachment position in the optimum arrangement to shorten the mounting processing time, and introduces the common arrangement and the comb tooth arrangement in which the setup change time is shorter in a stepwise manner, thereby setting the attachment position in which the setup change time is within the target time. In mounting system 10, by setting the attachment position of feeder 17 in this manner, the mounting processing time and the setup change time are balanced, a degree of priority of the comb tooth arrangement requiring a large number of vacant slots is lowered, and thus, it is possible to further suppress the increase in the total number of attachment sections and further suppress the total number of necessary mounting devices 15.

Meanwhile, when it is determined in S190 that there is no vacant slot that is not to be used, CPU 91 sets the current attachment position to a reference value that does not satisfy the target time on the assumption that the setup change time cannot clear the target time in the change of the attachment position (S210). CPU 91 may change the degree of priority to be selected, execute the change to the common arrangement and the comb tooth arrangement again, and execute the processing of obtaining the attachment position closer to the target time. At this time, CPU 91 may associate the time required for the setup change in the setting of the reference value with the attaching arrangement. In this way, CPU 91 sets the attachment position within the range of the total number of attachment sections.

Figure 8:
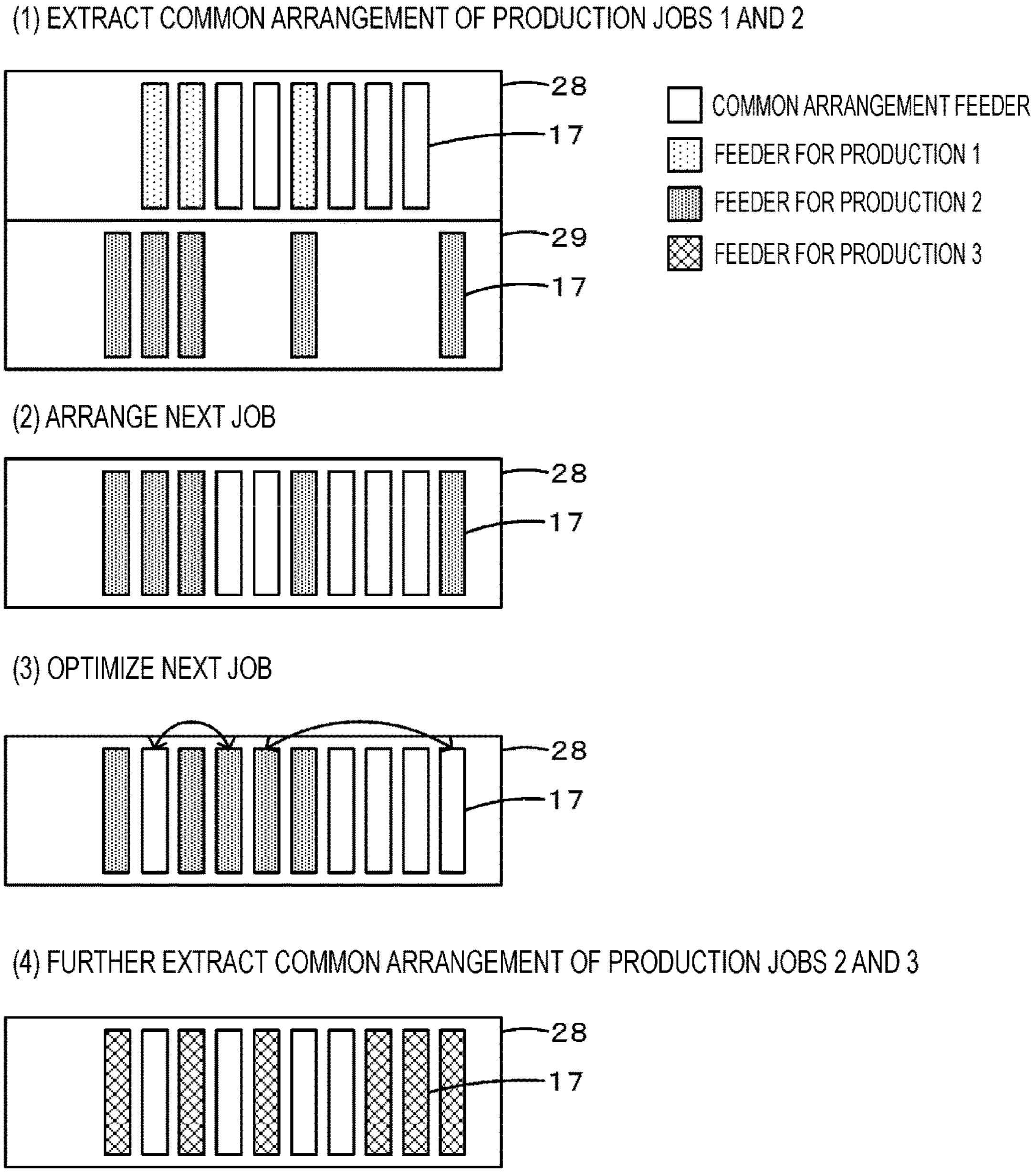
FIG. 8 is a diagram illustrating an example of the optimum arrangement processing after the balance arrangement process.

Meanwhile, when the time required for the setup change is within the target time in S160, CPU 91 sets the optimum arrangement again at the attachment position currently set within the range satisfying the target time while considering the simultaneous collection processing (S220). That is, CPU 91 sets the attachment position in consideration of one or more of the optimum arrangement, the common arrangement, and the comb tooth arrangement as the temporary attachment position, and then further executes the optimum arrangement processing of shortening the mounting processing time within the range satisfying the target time to set the attachment position. CPU 91 may set the attachment position such that the attachment position at which the simultaneous collection process can be performed is not changed as much as possible. Further, CPU 91 may maintain the position of the common arrangement in consideration of the influence on the next production, and may set the optimum arrangement by giving priority to moving the other feeders 17. Further, in the optimum arrangement processing, the operation of loader 18 may be predicted based on the time required for the standard movement of loader 18 and the time required for the exchange process of feeder 17, and it may be determined whether the target time is satisfied. FIG. 8 is a diagram illustrating an example of the optimum arrangement processing after the balance arrangement process. As illustrated in FIG. 8, in the optimum arrangement processing, CPU 91 extracts the common arrangement (1), arranges feeder 17 of the next production job in mounting attachment section 28 (2), and executes the optimum arrangement processing (3). Subsequently, CPU 91 further extracts the common arrangement with the next production job (4), and repeats the processing of (1) to (4). When the optimum arrangement processing is executed again, the setup change time satisfies the target time, and the mounting processing time may be further shortened.

After S220 or S210, CPU 91 determines the attachment position of the set next production type (S230) and determines whether the attachment positions of all the production types are set (S240). When the attachment positions of all the production types are not set, CPU 91 executes the processing of S130 and thereafter. That is, in S130, the next production type is set as the current production type, and after the optimum arrangement of the next production type is acquired, the processing of introducing the common arrangement and the comb tooth arrangement in a stepwise manner is executed so as to satisfy the target time, and the attachment position of feeder 17 of the next production type is set (S150 to 200). Meanwhile, when the attachment positions of all the production types are set in S240, CPU 91 stores attachment position information 95 including all the attachment positions in storage section 92, outputs attachment position information 95 to management device 14 and mounting device 15 (S250), and ends this routine.

Then, mounting device 15 or loader 18 of mounting system 10 executes the mounting process using the set attachment position information 95. Therefore, in mounting device 15, it is possible to balance the suppression of the increase in the number of slots, the shortening of the mounting processing time, and the shortening of the setup change time based on the target time of the setup change, and it is possible to suppress the device introduction cost and further improve the production efficiency.

FIG. 9 is a diagram illustrating an example of item evaluation in various setup. In FIG. 9, "common arrangement (individual)" means a setup in which the setup change occurs in the middle of production even in the common arrangement, and "common arrangement (fixed)" means a setup in which the setup change is not performed in all the production and the setup change is fixed. In addition, the "large setup change" means an operation in which feeder 17 is significantly changed for each production type, and the "small setup change" means an operation in which feeder 17 is slightly changed for each production type. Only by the optimum arrangement, the mounting processing time can be shortened in each production type, but since the commonality of feeders 17 is not considered, the setup change time becomes long. In addition, although the setup change time can be shortened only by the common arrangement, since the mounting processing time is not taken into consideration, this is prolonged, and the total number of attachment sections also tends to increase. Further, although the setup change time can be further shortened only by the comb tooth arrangement, it is insufficient to shorten the mounting processing time and to reduce the total number of the attachment sections. As described above, in the setting of the attachment position of feeder 17, a method of setting the attaching arrangement in which the shortening of the mounting processing time, the shortening of the setup change time, and the suppression of the increase in the total number of attachment sections are balanced has not been considered in the related art. In integrating device 19 of the present embodiment, based on production plan information 93 and target time 96 related to the setup change of feeder 17, attachment position information 95 related to the attachment position of feeder 17 for balancing these can be set for each production type.

Here, a correspondence relationship between the elements of the present embodiment and the elements of the present disclosure will be clarified. Mounting device 15 of the present embodiment corresponds to a mounting device, integrating device 19 corresponds to an information processing device, loader 18 corresponds to a movable working device, feeder 17 corresponds to a component supply device, and mounting system 10 corresponds to a mounting system. Integrating control section 90 corresponds to a control section, attachment position information 95 corresponds to attachment position information, production plan information 93 corresponds to a production plan, and substrate S corresponds to a processing target object. In the present embodiment, an example of an information processing method of the present disclosure is also clarified by explaining the operation of integrating control section 90.

Integrating device 19 as the information processing device described above is used in mounting system 10 including mounting device 15 that includes the multiple attachment sections as the component supply devices on which feeders 17 are attached and mounts components P on substrate S as the processing target object. Integrating device 19 sets attachment position information 95 related to the attachment position of feeder 17 for each production type based on production plan information 93 including multiple production types of substrates S and target time 96 related to the setup change of feeder 17. In integrating device 19, since the attachment position of feeder 17 is set based on production plan information 93 and target time 96 related to the setup change, it is possible to set the attachment position for executing the setup change satisfying the target time according to the production plan. Then, mounting device 15 performs the mounting process using the attachment position, thereby further improving the production efficiency. In addition, integrating control section 90 can set the attachment position at which the mounting processing time required for the production types and the setup change time are balanced.

In addition, integrating control section 90 sets the attachment position in consideration of one or more of the optimum arrangement indicating the shortest time of the current production type, the common arrangement in which the attachment position of the next production type is made common, and the comb tooth arrangement in which the attachment position of the next production type is vacant, without considering the common with the other production type. For example, in the mounting process, it is possible to keep the mounting processing time within a more appropriate time in consideration of the optimum arrangement, it is possible to further shorten the time required for the setup change in consideration of the common arrangement, it is possible to simultaneously arrange the current production type and the next production type to the attachment section in consideration of the comb tooth arrangement, and it is possible to further shorten the time required for the setup change. Accordingly, in integrating device 19, the time required for the mounting process and the setup change is set to be in a more appropriate range, thereby further improving the production efficiency. After setting the optimum arrangement, integrating control section 90 sets the attachment position including the common arrangement and the comb tooth arrangement within the target time. In integrating device 19, within the target time, the optimum arrangement can be prioritized, and the time required for the mounting process can be shortened, and when the time required for the setup change does not fall within the target time, the common arrangement or the comb tooth arrangement can be used to meet the target time as much as possible. For this reason, the efficiency of the entire production plan can be further improved in integrating device 19. Further, integrating control section 90 moves it from a position where it is once arranged to set the attachment position which provides the comb tooth arrangement. In integrating device 19, for example, by lowering the degree of priority of the comb tooth arrangement requiring a larger number of attachment sections, it is possible to further suppress an increase in the required number of attachment sections.

Further, mounting device 15 includes the attachment section including mounting attachment section 28 capable of collecting component P and buffer attachment section 29 incapable of collecting component P, mounting system 10 includes loader 18 that moves feeder 17 between mounting attachment section 28 and buffer attachment section 29, and integrating control section 90 sets attachment position information 95 including the attachment position of mounting attachment section 28 of the current production type and the attachment position of buffer attachment section 29 of the next production type. In integrating device 19, feeder 17 of the current production type is arranged on mounting attachment section 28, feeder 17 of the next production type is arranged on buffer attachment section 29, and thus, the time required for the setup change can be shortened. Furthermore, integrating control section 90 sets the attachment position in consideration of the comb tooth arrangement in which the attachment positions of mounting attachment section 28 and buffer attachment section 29 do not overlap each other, and the attachment position of the next production types is vacant. Since integrating device 19 employs the attachment position where mounting attachment section 28 and buffer attachment section 29 do not overlap each other, it is possible to rapidly execute the setup change processing. Then, integrating control section 90 sets the optimum arrangement, sets the common arrangement to at least a part when the optimum arrangement does not fall within the target time, and sets the comb tooth arrangement to at least a part when the common arrangement does not fall within the target time. In integrating device 19, the optimum arrangement can be prioritized within the target time, and the time required for the mounting process can be further shortened. In addition, since integrating device 19 gives priority to the next common arrangement when the time required for the setup change does not fall within the target time, the time required for the setup change can be further shortened. Further, in integrating device 19, by giving priority to the comb tooth arrangement next, it is possible to further shorten the time required for the setup change and further suppress an increase in the number of attachment sections.

Furthermore, mounting device 15 includes mounting section 30 capable of executing the simultaneous collection process of collecting the multiple components P at the same collection timing, and integrating control section 90 sets attachment position information 95 including the attachment position of feeder 17 in consideration of the simultaneous collection process. In integrating device 19, the time required for the mounting process can be further shortened by adding the simultaneous collection process. In addition, in mounting system 10, the total number of attachment sections is predetermined, and integrating control section 90 sets attachment position information 95 within the range of the total number of attachment sections. In integrating device 19, it is possible to set the attachment position satisfying the target time within a range of a predetermined total number of attachment sections. Further, integrating control section 90 sets the attachment position in consideration of one or more of the optimum arrangement, the common arrangement, and the comb tooth arrangement as the temporary attachment position, and then further executes the optimum arrangement processing of further shortening the mounting processing time within a range satisfying the target time to set the attachment position. In integrating device 19, it is possible to further shorten the mounting processing time while optimizing the time required for the setup change using the target time. Since integrating control section 90 uses production plan information 93 in which the order is set based on the commonality of components P, commonalization for each production type is easily improved, and it is possible to shorten the setup change time by further suppressing the change of the attachment position. In addition, mounting system 10 includes integrating device 19 and mounting device 15 that includes multiple attachment sections to which feeders 17 are attached and performs the mounting process of components P on substrate S. Since mounting system 10 includes the above-described integrating device 19, production efficiency can be further improved.

It should be noted that the information processing device, the mounting system, and the information processing method of the present disclosure are not limited to the embodiments described above, and may be achieved in various modes as long as they fall within the technical scope of the present disclosure.

Figure 10:
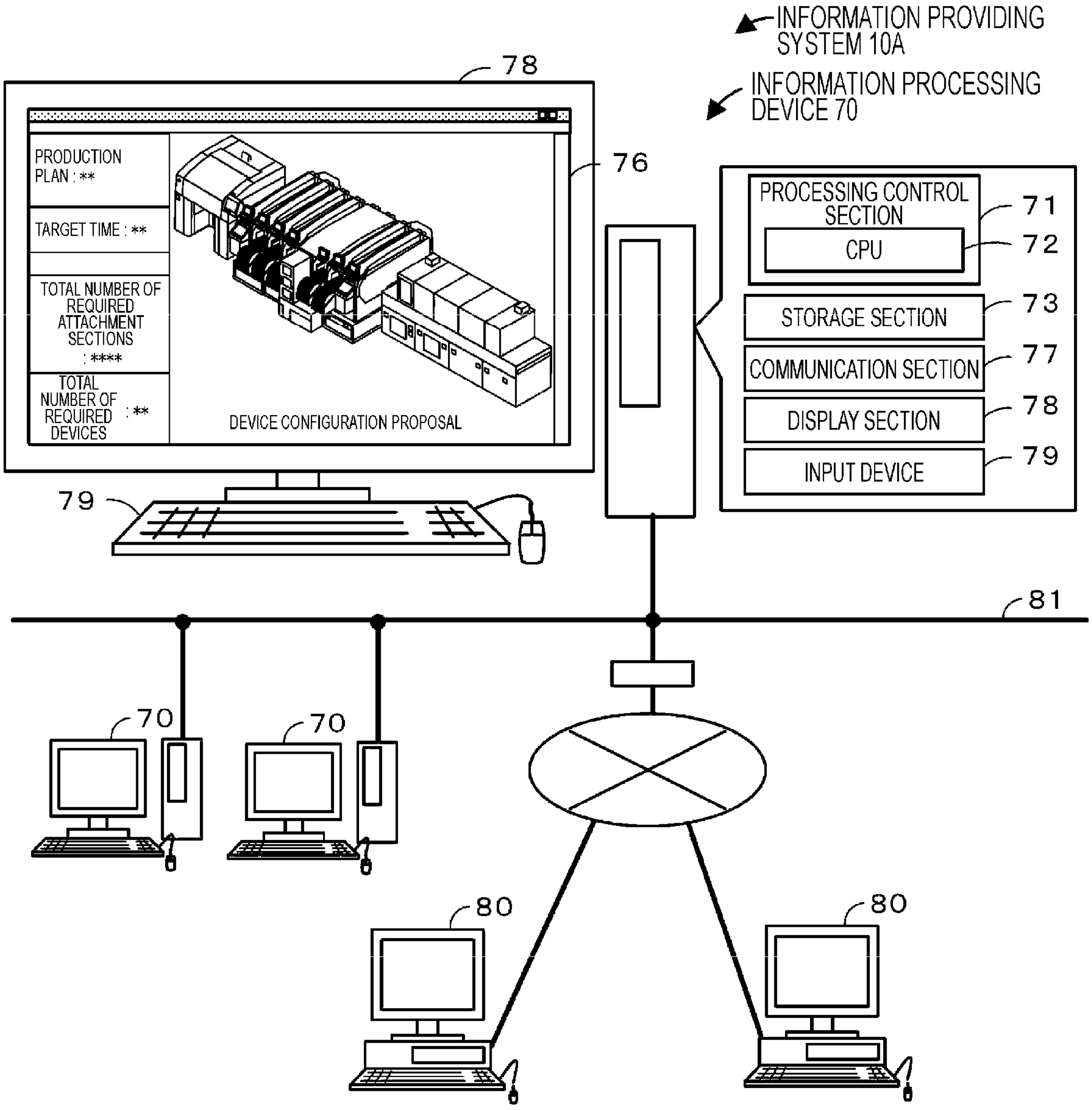
FIG. 10 is a schematic diagram illustrating an example of another information providing system 10A.
Figure 11:
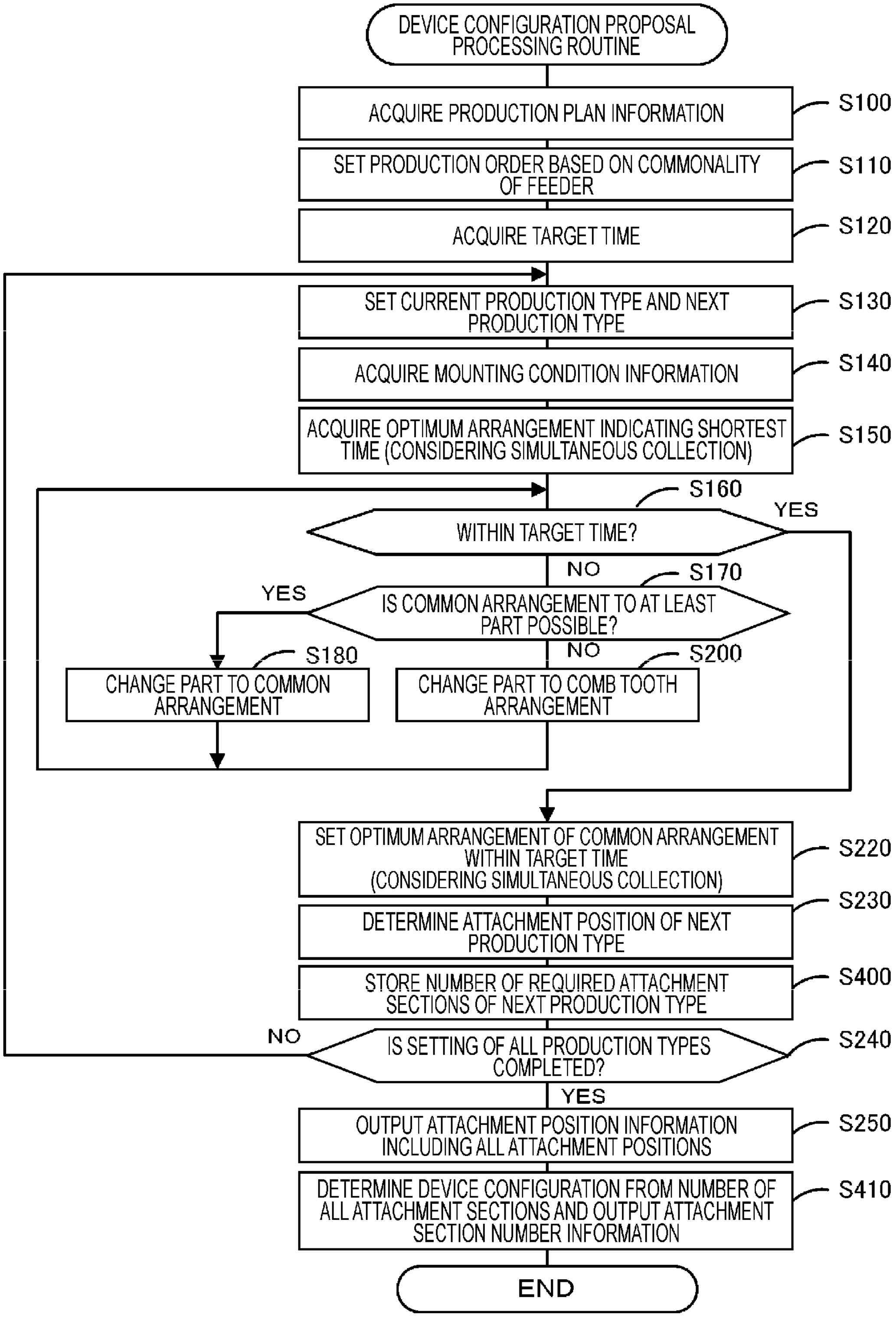
FIG. 11 is a flowchart illustrating an example of a device configuration proposal processing routine.

For example, in the above-described embodiment, integrating device 19 sets attachment position information 95; however, the configuration is not limited to this. In integrating device 19, the total number of attachment sections is specified, and attachment position information 95 satisfying the target time within the range is set, but, for example, when the total number of attachment sections is indefinite, mounting system 10 may obtain the necessary number of attachment sections of mounting device 15 in accordance with the setting of attachment position information 95, and output attachment section number information related to the obtained number of attachment sections. FIG. 10 is a schematic diagram illustrating an example of another information providing system 10A. FIG. 11 is a flowchart illustrating an example of a device configuration proposal processing routine executed by processing control section 71 of information processing device 70. Information providing system 10A is configured as a system that proposes the device configuration of mounting system 10 to customers, and includes multiple information processing devices 70 connected to network 81. Customer PC 80 is connected to information processing device 70 via the Internet. Similarly to integrating device 19, information processing device 70 includes processing control section 71 including CPU 72, storage section 73, communication section 77, display section 78, and input device 79. Information processing device 70 executes the device configuration proposal processing routine of FIG. 11, obtains the required total number of attachment sections and the number of mounting devices 15 based on the production plan information and the target time, and outputs the information to customer PC 80. In the device configuration proposal processing routine of FIG. 11, the same processes as those in the attachment position setting processing routine are denoted by the same reference numerals, and detailed description thereof is omitted. This routine is stored in storage section 73 of information processing device 70 and executed based on a request from customer PC 80. In this routine, the input of the total number of attachment sections of mounting system 10 in S120 is omitted, the processing of setting the comb tooth arrangement at the number of attachment sections or less in S180, S190, and S210 is omitted, the necessary number of attachment sections of the next production type is stored after S230 (S400), the necessary device configuration is derived and determined from the number of all attachment sections after S250, and the attachment section number information is output to the display section 74 or customer PC 80 (S410). Information provision screen 76 illustrated in FIG. 10 includes input fields for the production plan information and the target time, and an information provision field for displaying the total number of attachment sections, the number of devices, and an image diagram of the device configuration. In information processing device 70, the production plan and the target time are acquired, the comb tooth arrangement is increased until the target time is satisfied (S200), and thus, the total number of attachment sections that meet the target time can be determined, and the device configuration that satisfies the target time can be determined.

In the above-described embodiment, after the optimum arrangement is set, the common arrangement and the comb tooth arrangement are introduced stepwise from the state not satisfying the target time to the state satisfying the target time, the attachment position of feeder 17 is changed and determined; however, the configuration is not limited to this. For example, after setting the common arrangement, integrating control section 90 may change and fix the attachment position of feeder 17 by introducing the optimum arrangement in a stepwise manner during a period from when the target time is satisfied to when the target time is not satisfied. In this case, integrating control section 90 needs only to mainly perform the processing described in FIG. 8 in S220. Also in integrating device 19, it is possible to further improve the production efficiency based on the target time of the setup change.

In the above-described embodiment, integrating control section 90 uses the common arrangement and the comb tooth arrangement in a stepwise manner, but the present disclosure is not particularly limited thereto, either the common arrangement or the comb tooth arrangement may be omitted, or in addition to or in place of these, other methods for shortening the setup change time may be introduced. Also in integrating device 19, it is possible to further improve the production efficiency based on the target time of the setup change.

In the above-described embodiment, mounting device 15 includes supply section 27 having mounting attachment section 28 and buffer attachment section 29, feeder 17 is moved by loader 18, but the configurations may be omitted. Further, integrating device 19 may omit the comb tooth arrangement in which the attachment positions of mounting attachment section 28 and buffer attachment section 29 do not overlap each other. Even when the operator attaches feeder 17 to supply section 27, since the attachment position satisfying the target time of the setup change is obtained, the production efficiency can be further improved based on the target time of the setup change.

In the embodiment described above, mounting section 30 can execute the simultaneous collection process at two positions of first lifting and lowering position A and second lifting and lowering position B; however, the configuration is not limited to this, and mounting section 30 may execute the simultaneous collection process at three positions or more. Alternatively, mounting section 30 needs not be able to execute the simultaneous collection process. In this case, integrating control section 90 can freely change the attachment position without considering the interval between first lifting and lowering position A and second lifting and lowering position B.

In the above-described exemplary embodiment, after the attachment position in consideration of one or more of the optimum arrangement, the common arrangement, and the comb tooth arrangement is set as the temporary attachment position in S220, the attachment position is set by performing optimum arrangement processing again to further shorten the mounting processing time within the range that satisfies the target time; however, the configuration is not limited to this, and this processing may be omitted. Also with this integrating device 19, the production efficiency can be further improved based on the target time of the setup change.

In the above-described embodiment, integrating control section 90 uses production plan information 93 in which the order is set based on the commonality of components P; however, the configuration is not particularly limited to this, and production plan information 93 in which the order is not set based on the commonality of the components may be used. In the production plan, even when the mounting efficiency such as the commonality is ignored, there may be a production type desired to be manufactured first, and thus integrating control section 90 may execute the balance processing in a predetermined production order.

In the above-described embodiment, integrating device 19 has the function of the information processing device; however, the configuration is not limited to this, for example, one or more of management control section 40 of management device 14 and mounting control section 20 of mounting device 15 or other devices may have the function of the information processing device of the present disclosure.

In the embodiment described above, the present disclosure is applied to the forms of mounting system 10, integrating device 19, and information processing device 70; however, the present disclosure may be a program that causes a computer to execute each step of the information processing method.

Here, the information processing method of the present disclosure may be configured as follows. For example, according to the present disclosure, there is provided an information processing method used in a mounting system including a mounting device that includes multiple attachment sections configured to attach a component supply device, the mounting device being configured to perform a mounting process of a component on a processing target object, the method including setting, for each production type, attachment position information related to an attachment position of the component supply device based on a production plan including multiple production types of the processing target object and a target time related to setup change of the component supply device.

In this information processing method, similarly to the above-described information processing device, since the attachment position of the component supply device is set based on the production plan and the target time related to the setup change, it is possible to set the attachment position for executing the setup change satisfying the target time according to the production plan. The mounting device executes the mounting process at the attachment position, thereby further improving the production efficiency. In this information processing method, various aspects of the information processing device described above may be adopted, or steps for achieving the functions of the information processing device described above may be added.

INDUSTRIAL APPLICABILITY

The present disclosure is applicable to a technical field of devices for performing a mounting process of a component.

REFERENCE SIGNS LIST

10: mounting system, 10A: information providing system, 11: printing device, 12: print inspection device, 13: storage device, 14: management device, 15: mounting device, 16: automatic conveyance vehicle, 17: feeder, 18: loader (movable working device), 18*a*: X axis rail, 19: integrating device, 20: mounting control section, 21: CPU, 22: storage section, 24: mounting condition information, 25: attachment position information, 26: substrate processing section, 27: supply section, 28: mounting attachment section, 29: buffer attachment section, 30: mounting section, 31: head moving section, 32: mounting head, 33, 33*a*, 33*b*: collection members, 34: imaging section, 37: communication section, 38: slot, 39: connection section, 40: management control section, 41: CPU, 42: storage section, 43: production plan information, 44: mounting condition information, 45: attachment position information, 47: communication section, 48: display section, 49: input device, 50: movement control section, 51: CPU, 52: storage section, 54: accommodation section, 55: exchange section, 56: moving section, 57: communication section, 70: information processing device, 71: processing control section, 72: CPU, 73: storage section, 76: information provision screen, 77: communication section, 78: display section, 79: input device, 80: customer PC, 81: network, 90: integrating control section, 91: CPU, 92: storage section, 93: production plan information, 94: mounting condition information, 95: attachment position information, 96: target time, 97: communication section, 98: display section, 99: input device, A: first lifting and lowering position, B: second lifting and lowering position, P: component, S: substrate, W: operator

The invention claimed is:

1. An information processing device for use in a mounting system comprising:

a mounting device that includes multiple attachment sections configured to attach a component supply device, the mounting device being configured to perform mounting process of a component on a processing target object, the information processing device comprising:

a control section including a processor configured to set, for each production type, attachment position information related to an attachment position of the component supply device based on a production plan including multiple production types of the processing target object and a target time related to setup change of the component supply device, wherein the control section sets an optimum arrangement indicating a shortest time of a current production type without considering a common arrangement with another production type, sets at least a part of the common arrangement in which an attachment position of a next production type is common when the optimum arrangement does not fall within the target time, and sets at least a part of a comb tooth arrangement in which the attachment position of the next production type is vacant when the common arrangement does not fall within the target time.

2. The information processing device according to claim 1, wherein the control section sets the attachment position in consideration of one or more of the optimum arrangement indicating the shortest time of the current production type, the common arrangement in which the attachment position of the next production type is common, and the comb tooth arrangement in which the attachment position of the next production type is vacant, without considering the common with another production type.

3. The information processing device according to claim 2, wherein the control section moves it from a position where it is once arranged to set the attachment position which provides the comb tooth arrangement.

4. The information processing device according to claim 1, wherein the mounting device includes the attachment section including a mounting attachment section capable of collecting the component and a buffer attachment section incapable of collecting the component, and the mounting system includes a movable working device configured to move the component supply device between the mounting attachment section and the buffer attachment section, and the control section sets the attachment position information including an attachment position of the mounting attachment section of a current production type and an attachment position of the buffer attachment section of a next production type.

5. The information processing device according to claim 4, wherein the control section sets the attachment position in consideration of the comb tooth arrangement in which the attachment positions of the mounting attachment section and the buffer attachment section do not overlap each other and in which an attachment position of a next production type is vacant.

6. The information processing device according to claim 1, wherein the mounting device includes a mounting section capable of executing a simultaneous collection process of collecting multiple components at the same collection timing, and the control section sets the attachment position information including the attachment position of the component supply device in consideration of the simultaneous collection process.

7. The information processing device according to claim 1, wherein when a total number of attachment sections is not specified, the mounting system obtains a necessary number of attachment sections of the mounting device in accordance with the setting of the attachment position information, and outputs attachment section number information related to the obtained number of attachment sections.

8. The information processing device according to claim 1, wherein in the mounting system, a total number of attachment sections is predetermined, and the control section sets the attachment position information within a range of the total number of attachment sections.

9. The information processing device according to claim 1, wherein the control section sets, as a temporary attachment position, the attachment position in consideration of one or more of the optimum arrangement indicating the shortest time of the current production type, the common arrangement in which the attachment position of the next production type is common, and the comb tooth arrangement in which the attachment position of the next production type is vacant, without considering the common with another production type, and then, further executes optimum arrangement processing of further shortening a mounting processing time within a range satisfying the target time to set the attachment position.

10. The information processing device according to claim 1, wherein the control section uses the production plan in which an order is set based on a commonality of components.

11. A mounting system comprising:

the information processing device according to claim 1; and a mounting device that includes multiple attachment sections configured to attach a component supply device, the mounting device being configured to perform a mounting process of a component on a processing target object.

12. An information processing method used in a mounting system including a mounting device that includes multiple attachment sections configured to attach a component supply device, the mounting device being configured to perform mounting process of a component on a processing target object, the method comprising:

setting, for each production type, attachment position information related to an attachment position of the component supply device based on a production plan including multiple production types of the processing target object and a target time related to setup change of the component supply device; and setting an optimum arrangement indicating a shortest time of a current production type without considering a common arrangement with another production type, setting at least a part of the common arrangement in which an attachment position of a next production type is common when the optimum arrangement does not fall within the target time, and setting at least a part of a comb tooth arrangement in which the attachment position of the next production type is vacant when the common arrangement does not fall within the target time.

* * * * *